United States Patent
Hong

(10) Patent No.: US 7,781,345 B2
(45) Date of Patent: Aug. 24, 2010

(54) METHOD OF MANUFACTURING IMPRINT SUBSTRATE AND IMPRINTING METHOD

(75) Inventor: Pil-Soon Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 111 days.

(21) Appl. No.: 12/260,974

(22) Filed: Oct. 29, 2008

(65) Prior Publication Data

US 2009/0286379 A1    Nov. 19, 2009

(30) Foreign Application Priority Data

May 15, 2008  (KR) ...................... 10-2008-0044846

(51) Int. Cl.
*H01L 21/312* (2006.01)
(52) U.S. Cl. .............................. 438/703; 257/E21.029; 430/310; 430/326
(58) Field of Classification Search ................. 438/703, 438/947; 257/E21.029; 430/310, 326
See application file for complete search history.

(56) References Cited

U.S. PATENT DOCUMENTS

| | | | |
|---|---|---|---|
| 6,663,820 B2 * | 12/2003 | Arias et al. ................. | 264/496 |
| 6,753,131 B1 * | 6/2004 | Rogers et al. ............... | 430/322 |
| 6,759,183 B2 * | 7/2004 | Nagao et al. ................ | 430/320 |
| 7,063,939 B2 * | 6/2006 | Liao et al. ................... | 430/325 |
| 7,560,785 B2 * | 7/2009 | Yu et al. ..................... | 257/401 |
| 7,696,100 B2 * | 4/2010 | Maekawa .................... | 438/720 |
| 2007/0164458 A1 * | 7/2007 | Ogino et al. ................ | 257/797 |
| 2008/0142680 A1 * | 6/2008 | Usa et al. .................... | 249/160 |
| 2008/0211133 A1 * | 9/2008 | Terasaki et al. ............. | 264/219 |
| 2009/0023288 A1 * | 1/2009 | Jeong et al. ................. | 438/670 |
| 2009/0286379 A1 * | 11/2009 | Hong .......................... | 438/406 |

FOREIGN PATENT DOCUMENTS

| | | |
|---|---|---|
| JP | 2004-304-097 A | 10/2004 |
| JP | 2007-128083 A | 5/2007 |
| KR | 1020060135316 A | 12/2006 |
| KR | 1020070096544 A | 10/2007 |

* cited by examiner

*Primary Examiner*—George Fourson
(74) *Attorney, Agent, or Firm*—Innovation Counsel LLP

(57) ABSTRACT

In a method of manufacturing an imprint substrate, a concave pattern, which is recessed, is formed on a top surface of the mold substrate. A light blocking layer is formed on the concave pattern and the top surface of the mold substrate. After bonding an adhesive substrate to the mold substrate such that the adhesive substrate faces the mold substrate, the adhesive substrate is separated from the mold substrate, so that the light blocking layer on the top surface is removed from the mold substrate. An imprint substrate having the light blocking layer only on the concave pattern is formed.

18 Claims, 8 Drawing Sheets

METHOD OF MANUFACTURING IMPRINT SUBSTRATE AND IMPRINTING METHOD

CROSS-REFERENCE TO RELATED APPLICATION

This application claims priority to Korean Patent Application No. 2008-44846 filed on May 15, 2008, the contents of which are herein incorporated by reference in their entirety.

BACKGROUND

1. Field of the Invention

The present invention relates to semiconductor device fabrication. More particularly, the present invention relates to a method of manufacturing an imprint substrate and an imprinting method.

2. Description of the Related Art

Generally, the forming of nano-scale micro patterns is performed via nano-imprint technology. This nano-imprint technology is a lithography technology useful to form a device, such as a liquid crystal display panel or a semiconductor chip, stacked with thin films having micro patterns.

In current nano-imprint technology, after loading a patterned mold substrate on a processing substrate having a thin film thereon, the mold substrate is pressed against the process substrate, so that the thin film is patterned according to the pattern of the mold substrate. Since such a nano-imprint technology simplifies the patterning process of the thin film, productivity is improved, and the manufacturing cost is reduced.

In this nano-imprint technology, the mold substrate is pressed against the processing substrate such that the thin film of the processing substrate flows around the contours of the mold substrate, thereby forming the micro pattern on the thin film. Therefore, the degree of uniformity of the micro pattern is determined at least partially according to the flow degree, the flow direction, and the flow rate of the thin film. The flow degree and the flow direction of the thin film are, in turn, determined at least partially according to the pattern shape of the mold substrate. However, the flow degree and the flow direction of the thin film are not always easily controlled. Accordingly, the thickness of the thin film may become irregular, and the thin film is not always completely removed from a region where it should be.

SUMMARY

Exemplary embodiments of the present invention provide a method of manufacturing an imprint substrate capable of simplifying the manufacturing process of the imprint substrate.

Exemplary embodiments of the present invention also provide an imprinting method capable of reducing the failure rate of an imprinting process.

In one embodiment, a method of manufacturing an imprint substrate comprises receiving a mold substrate formed therein with a concave pattern recessed from a top surface of the mold substrate, the mold substrate further comprising a light blocking layer on the concave pattern and the top surface of the mold substrate. The method also includes bonding the mold substrate to an adhesive substrate such that the light blocking layer formed on the top surface contacts the adhesive substrate. The method further includes forming a light blocking pattern on the concave pattern by separating the adhesive substrate from the mold substrate to partially remove portions of the light blocking layer contacting the adhesive substrate.

In another embodiment, an imprinting method comprises receiving a mold substrate, and receiving a processing substrate having a photoresist film formed thereon. The mold substrate is provided on the photoresist film, and the mold substrate is pressed against the photoresist film. The photoresist film corresponding to a top surface of the mold substrate is removed through a photolithography process employing the mold substrate as a mask.

In another embodiment, a method of manufacturing a thin film transistor substrate comprises preparing a mold substrate with a concave pattern recessed from a top surface of the mold substrate, and forming a light blocking layer on the concave pattern and the top surface of the mold substrate. The method further includes preparing an adhesive substrate facing the mold substrate, and bonding the mold substrate to the adhesive substrate such that the light blocking layer formed on the top surface makes contact with the adhesive substrate. A light blocking pattern is formed on the concave pattern of the mold substrate by separating the adhesive substrate from the mold substrate to partially remove the light blocking layer. The method also includes sequentially forming a gate electrode, a gate insulating layer, a silicon layer, a metal layer, and a photoresist film on a substrate, and providing an imprint substrate on the photoresist film. A convex pattern is formed (the pattern corresponding to the concave pattern formed on the imprint substrate) on the photoresist film by pressing the imprint substrate against the mold substrate. A photoresist pattern is formed on the metal layer by exposing and developing the photoresist film using the imprint substrate as a mask, so as to partially remove the photoresist film. A silicon pattern, a source electrode, and a drain electrode are formed on the gate insulating layer by etching the metal layer and the silicon layer using the photoresist pattern as a mask.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1A:
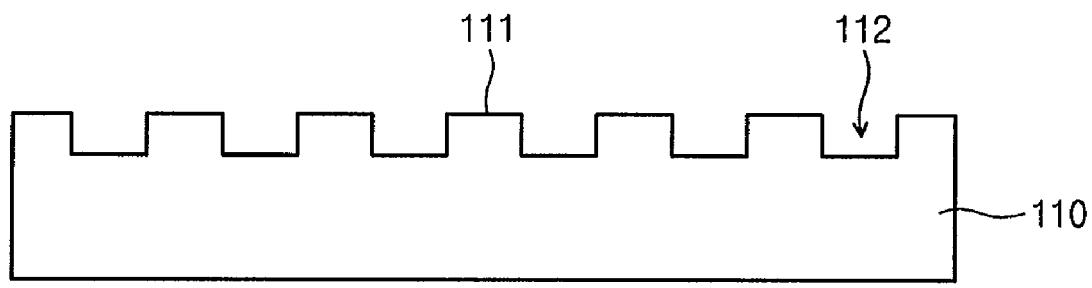
FIGS. 1A to 1D are views showing an exemplary embodiment of a method of manufacturing an imprint substrate according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIGS. 1A to 1D are views showing an exemplary embodiment of a method of manufacturing an imprint substrate according to the present invention.

Referring to FIG. 1A, a mold substrate 110 having a concave pattern 112 is prepared. The concave pattern 112 is recessed from a top surface 111 of the mold substrate 110. In the present exemplary embodiment of the present invention, the mold substrate 110 may include quartz.

Figure 1B:
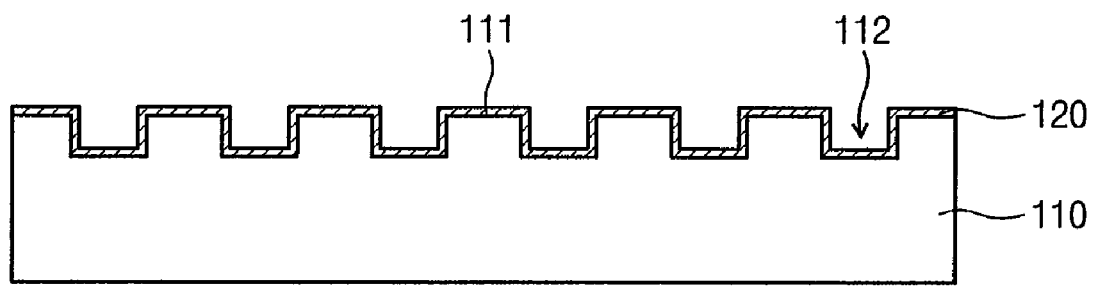

As shown in FIG. 1B, a metal material that blocks light can be deposited on both the concave pattern 112 and the top surface 111 of the mold substrate 110, thereby forming a light blocking layer 120. As one example, the metal material of the light blocking layer 120 may include chromium (Cr).

Figure 1C:
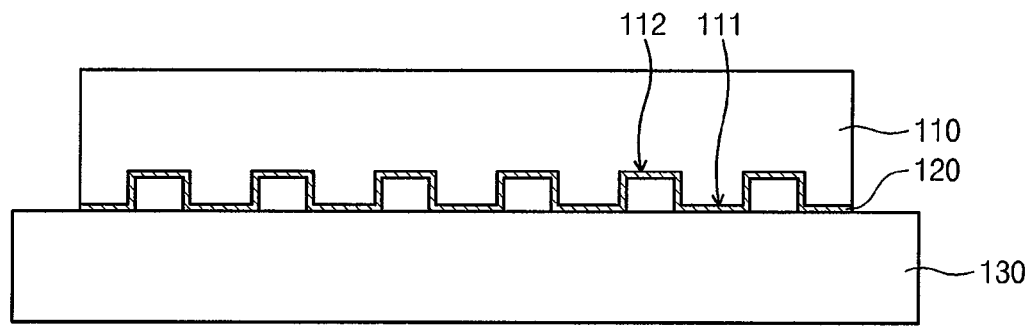

Referring to FIG. 1C, the light blocking layer 120 formed on the mold substrate 110 is attached to an adhesive substrate 130. Since the adhesive substrate 130 has a generally flat surface, mostly only the light blocking layer 120 formed the top surface 111 is attached to the adhesive substrate 130.

According to the present exemplary embodiment of the present invention, the adhesive substrate 130 may include epoxy resin. When attaching the adhesive substrate 130 to the mold substrate 110, epoxy resin having the degree of cure of about 70% or less can be used for the adhesive substrate 130. Thereafter, the adhesive substrate 130 is heated to a state in which the light blocking layer 120 is partially attached to the adhesive substrate 130. The adhesive substrate 130 can then be cured to a degree of cure of about 70% to about 100% by heat. It may be desirable for the adhesive substrate 130 to be cured to a point where cross-linking between the substrate 130 and the light blocking layer 120 occurs, so that an adhesive strength between the light blocking layer 120 and the adhesive substrate 130 is increased.

Subsequently, referring to FIG. 1D, the mold substrate 110 is separated from the adhesive substrate 130. In this case, the light blocking layer 120 formed on the top surface 111 of the mold substrate 110 is removed from the mold substrate 110 by the adhesive strength of the adhesive substrate 130, so that the light blocking layer 120 generally remains only in the concave pattern 112.

In this manner, a light blocking pattern 125 is formed only on the concave pattern 112. In other words, the area of the light blocking pattern 125 is defined as a light blocking area BA to block light, and an area of the top surface 111 of the mold substrate 110 is defined as a transmission area TA. That is, the above described method can be thought of as forming an imprint substrate 100 that is partitioned into light blocking areas BA and transmission areas TA.

As described above, the light blocking pattern 125 is formed on the imprint substrate 100 by selectively removing the light blocking layer 120 using the adhesive substrate 100, rather than employing a complex photolithography etching process. This can simplify the manufacturing process for the imprint substrate. In addition, one of ordinary skill in the art can see that mis-alignment between the light blocking pattern 125 and the concave pattern 112 can be reduced as compared with that of the photolithography etching process, as the adhesive substrate 130 has no pattern and need not be as carefully aligned with the top surface 111 as a photolithographic mask.

Hereinafter, an imprinting process employing the imprint substrate 100 shown in FIG. 1D will be described with reference to FIGS. 2A to 2D.

Figure 1D:
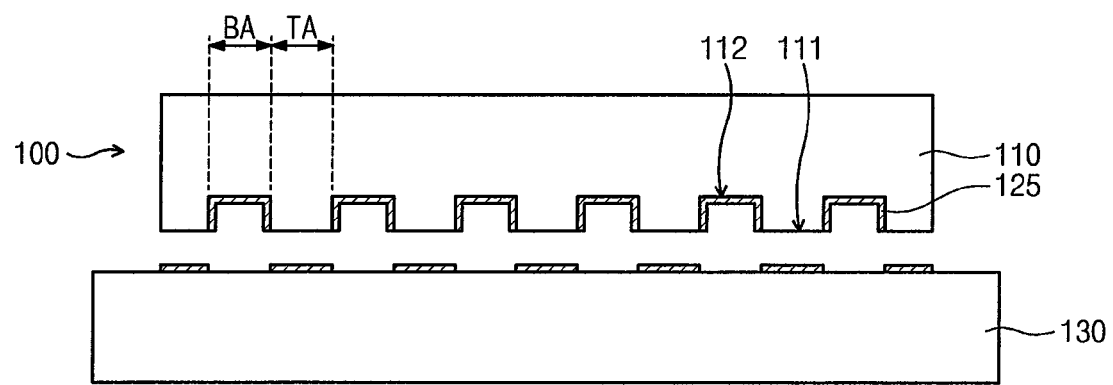

FIGS. 2A to 2D are views showing an imprinting process using the imprint substrate 100 shown in FIG. 1D.

Figure 2A:
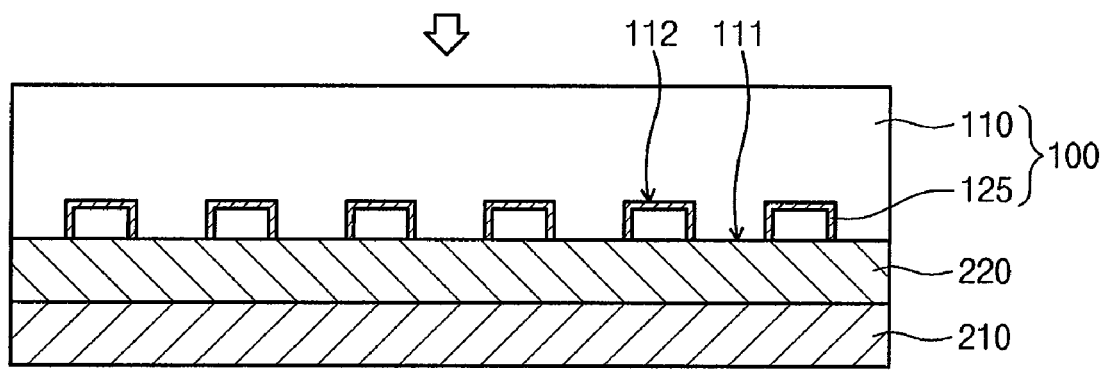
FIGS. 2A to 2D are views showing an imprinting process using an imprint substrate shown in FIG. 1D.

Referring to FIG. 2A, a photoresist film 220 is formed on a processing substrate 210. In the present exemplary embodiment of the present invention, the photoresist film 220 has a positive type.

Figure 2B:
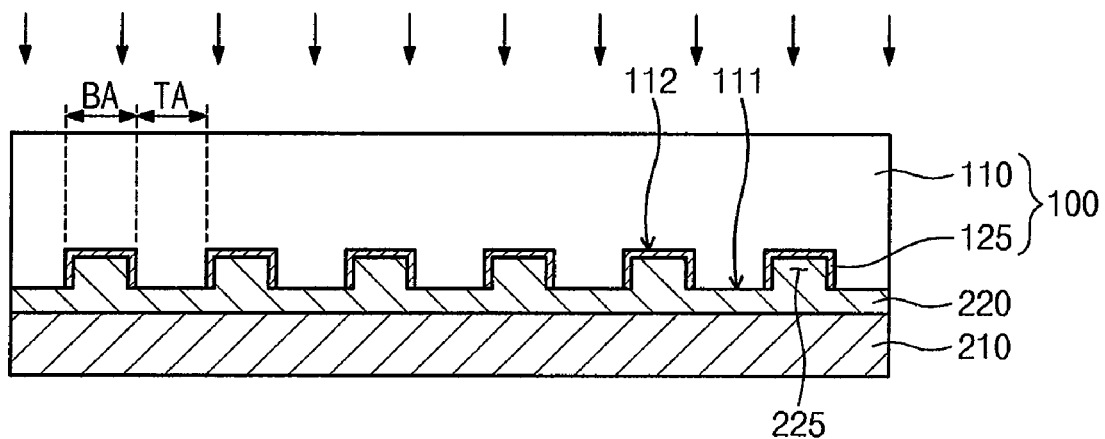

Thereafter, the imprint substrate 100 shown in FIGS. 1A to 1D is placed on the photoresist film 220. Subsequently, as shown in FIG. 2B, the imprint substrate 100 is pressed against the processing substrate 210, so that a convex pattern 225 is formed in an area the photoresist film 220 corresponding to the concave pattern 112.

In this state, an UV exposure process is performed by using the imprint substrate 100 as a mask. As a result, those portions of the photoresist film 220 corresponding to the light blocking areas BA are largely unexposed to UV radiation, while those portions of film 220 corresponding to light transmission areas TA are exposed.

Figure 2C:
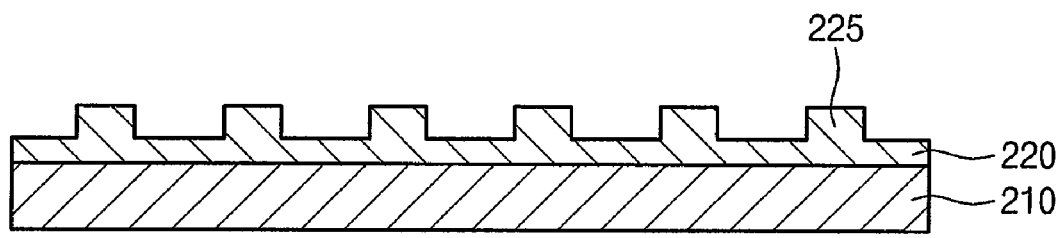
Figure 2D:
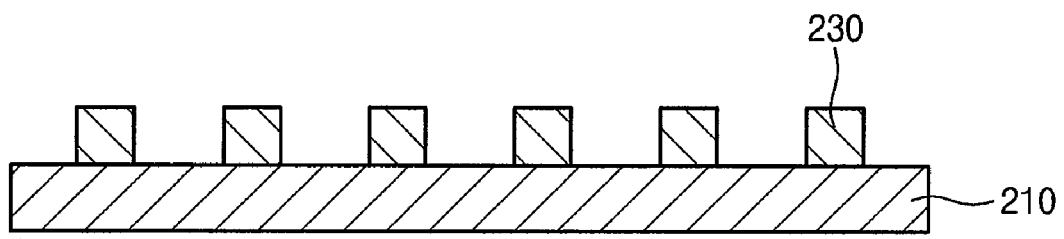

Then, as shown in FIG. 2C, the imprint substrate 100 is removed from the processing substrate 210. Subsequently, the exposed photoresist film 220 is developed by using a developing solution, so that the exposed portion of the photoresist film 220 is removed. Thus, a desired photoresist pattern 230 can be obtained as shown in FIG. 2D.

As described above, when the photoresist film 220 is patterned by using the imprint substrate 100 shown in FIG. 1D, the photoresist film 220 can be more easily removed from undesired areas, thus reducing failure of the imprinting process caused by undesired photoresist film.

FIGS. 3A to 3D are views showing the manufacturing process of a thin film transistor substrate used for a liquid crystal display. FIGS. 3A to 3D show a process of patterning a source/drain electrode and a silicon layer. In one embodiment of the invention, this process can be used in the manufacture of a thin film transistor substrate.

FIGS. 3A to 3D show a process of forming an imprint substrate used during the manufacturing process of the thin film transistor substrate. The same reference numbers will be assigned to elements corresponding to those shown in FIGS. 1A to 1D.

Figure 3A:
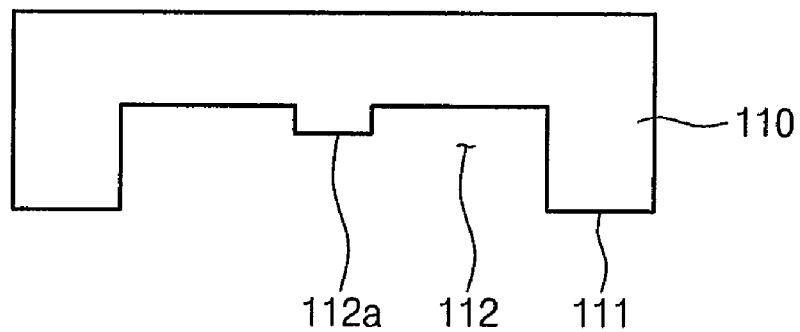
FIGS. 3A to 3D are views showing the manufacturing process of a thin film transistor substrate used for a liquid crystal display.

Referring to FIG. 3A, a mold substrate 110 having a concave pattern 112 can be prepared in known fashion. As shown, the concave pattern 112 is recessed from the top surface 111 of the mold substrate 110. In this embodiment, the mold substrate 110 includes a protrusion 112a, which protrudes from the bottom surface of the concave pattern 112 and is lower than the top surface 111.

Figure 3B:
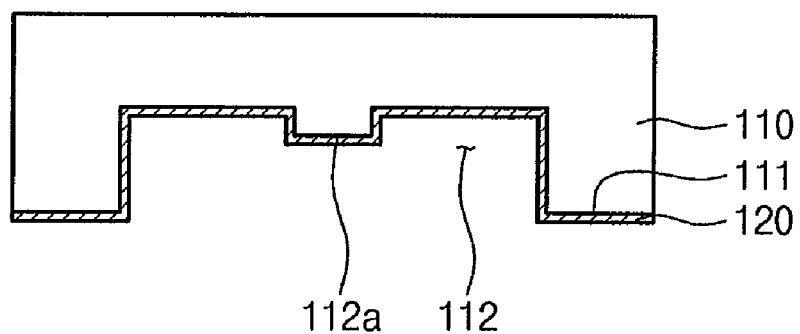
Figure 3C:
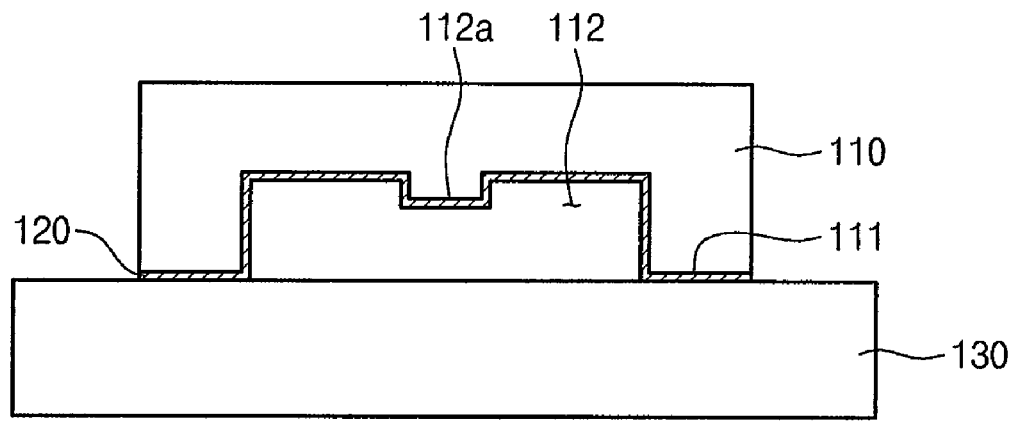

Then, as shown in FIG. 3B, light blocking layer 120 is formed on the concave pattern 112 and the top surface 111 of the mold substrate 110. Subsequently, as shown in FIG. 3C, the light blocking layer 120 is attached to the adhesive substrate 130. Then, as described above, only the light blocking layer 120 formed the top surface 111 is attached to the adhesive substrate 130.

Figure 3D:
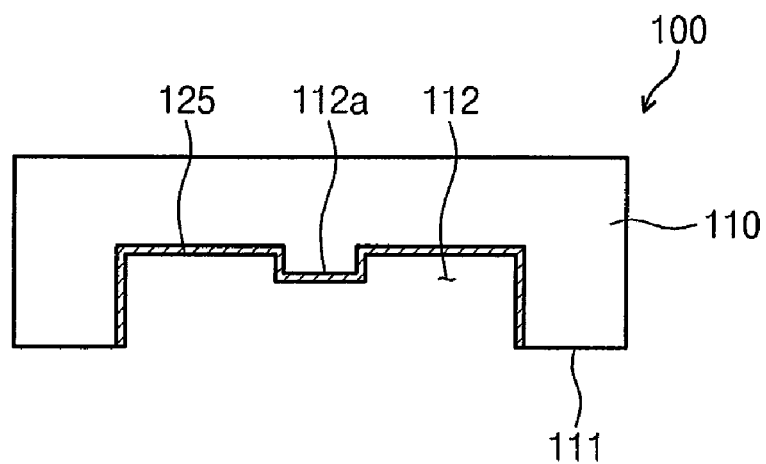

Next, referring to FIG. 3D, when the mold substrate 110 is separated from the adhesive substrate 130, the light blocking layer 120 on the top surface 111 is removed from the mold substrate 110 by removing adhesive substrate 130 as described previously. In this manner, the light blocking pattern 125 is generally formed only on the concave pattern 112 of the mold substrate 110, thereby forming the imprint substrate 100.

The mold substrate 110 can include rigid quartz, so that the mold substrate 110 may be prevented from sagging. This may help prevent that light blocking layer 120 which is formed on the protrusion 112a from becoming attached to the adhesive substrate 130. That is, a sufficiently rigid mold substrate 110 may help keep undesired portions of light blocking layer 120 from attaching to the adhesive substrate 130.

FIGS. 3E to 3H show a process of patterning the source/drain electrode and the silicon layer by using the imprint substrate 100.

Figure 3E:
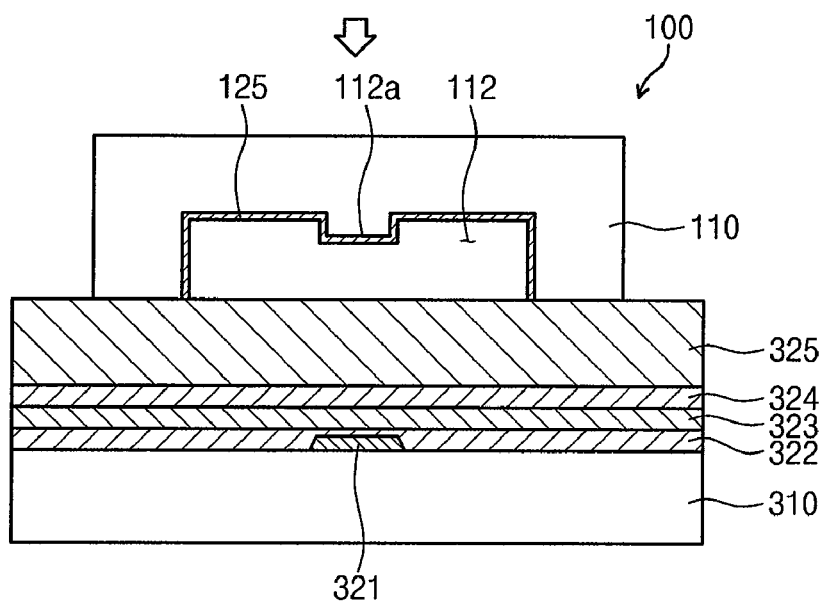
Figure 3F:
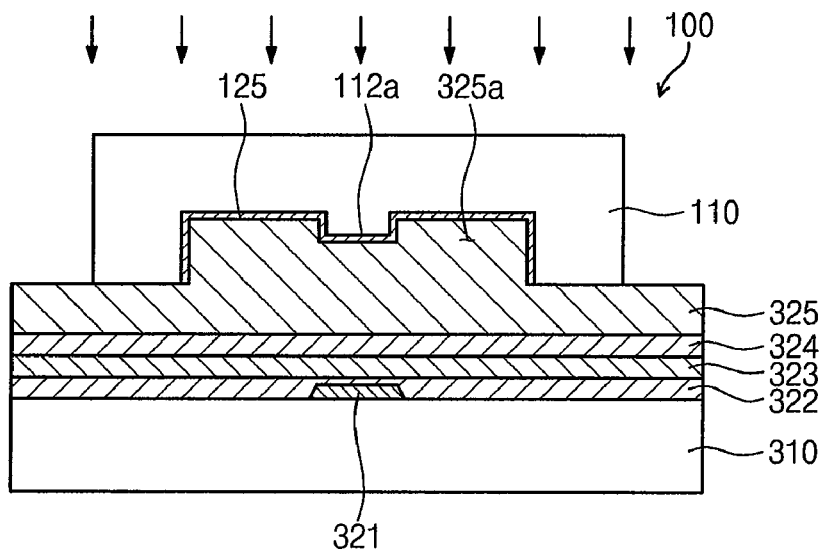

Referring to FIG. 3E, a gate electrode 321, a gate insulating layer 322, a silicon layer 323, a metal layer 324, and a photoresist film 325 are sequentially formed on a base substrate 310. Thereafter, the imprint substrate 100 shown in FIG. 3D is provided on the photoresist film 325. Subsequently, as shown in FIG. 3F, pressing the imprint substrate 100 against the base substrate 310 produces a convex pattern 325a corresponding to the concave pattern 112 of the imprint substrate 100 is formed on the photoresist film 325.

Figure 3G:
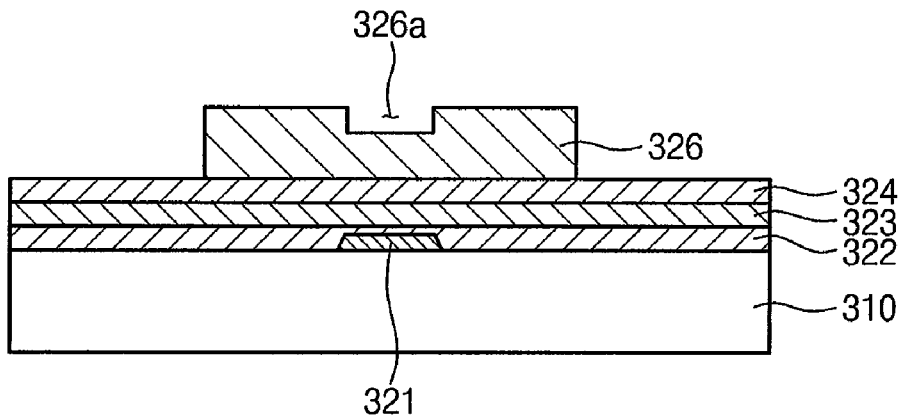
Figure 3H:
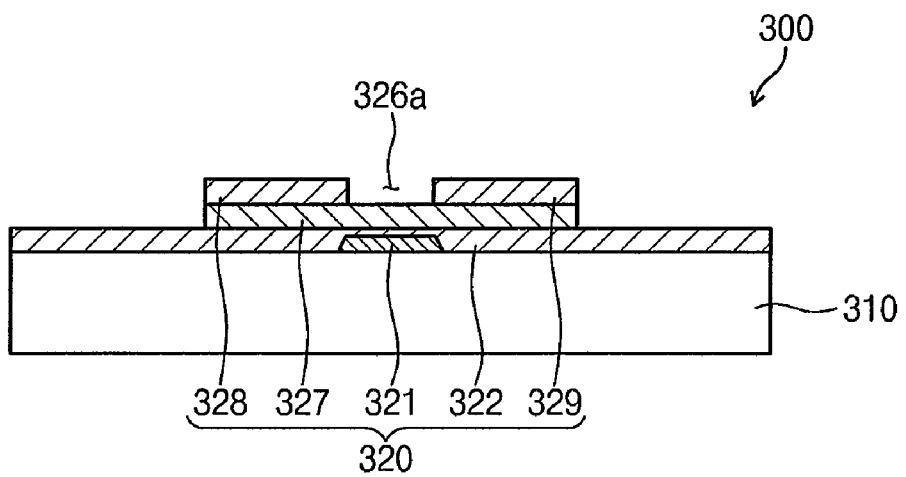

Thereafter, the photoresist film 325 is exposed and developed by using the imprint substrate 100 as a mask, so that the photoresist film 325 is removed except for the area of the light blocking pattern 125 as shown in FIG. 3G. Accordingly, a photoresist pattern 326 corresponding to the area of the light blocking pattern 125 is formed on the metal layer 324.

Of note, the photoresist pattern 326 is provided therein with a concave part 326a corresponding to the protrusion 112a of the imprint substrate 100. Subsequently, the metal layer 324 and the silicon layer 323 are etched by using the photoresist pattern 326 as a mask, so that the metal layer 324 and the silicon layer 323 are removed except for the area of the photoresist pattern 326. In an area of the concave part 326a, only the metal layer 324 is removed. Accordingly, a silicon pattern 327, a source electrode 328, and a drain electrode 329 are formed on the gate insulating layer 322. Accordingly, a thin film transistor substrate having a thin film transistor 320 may be formed on the base substrate 300.

In the above embodiments, the light blocking pattern is formed on the imprint substrate via a method involving delamination of a metal thin film, thereby simplifying the manufacturing process of the imprint substrate. The imprinting process is performed by fabricating a light blocking pattern on the above described imprint substrate, providing a more reliable imprinting process.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing an imprint substrate, the method comprising:
   receiving a mold substrate formed therein with a concave pattern recessed from a top surface of the mold substrate;
   forming a light blocking layer on the concave pattern and the top surface of the mold substrate;
   bonding the mold substrate to an adhesive substrate such that the light blocking layer formed on the top surface contacts the adhesive substrate; and
   forming a light blocking pattern on the concave pattern by separating the adhesive substrate from the mold substrate to partially remove portions of the light blocking layer contacting the adhesive substrate.

2. The method of claim 1, wherein the adhesive substrate comprises an epoxy resin.

3. The method of claim 2, further comprising, prior to the bonding the mold substrate, curing the epoxy resin to a degree of cure of about 70% or less by heating the adhesive substrate.

4. The method of claim 3, further comprising, prior to the separating the adhesive substrate, secondarily curing the epoxy resin to a degree of cure of about 70% or more by heating the adhesive substrate.

5. The method of claim 1, wherein the mold substrate comprises quartz.

6. The method of claim 1, wherein the light blocking layer comprises a metal thin film and is deposited on the mold substrate.

7. The method of claim 1, wherein the light blocking pattern is formed on surfaces defining the concave pattern.

8. An imprinting method comprising:
   forming an imprint substrate;
   receiving a processing substrate having a photoresist film formed thereon;
   providing the imprint substrate on the photoresist film;
   pressing the imprint substrate against the photoresist film; and
   removing the photoresist film corresponding to a top surface of the imprint substrate through a photolithography process employing the imprint substrate as a mask, wherein
   the forming of the imprint substrate comprises:
   receiving a mold substrate formed therein with a concave pattern recessed from a top surface of the mold substrate;
   forming a light blocking layer on the concave pattern and the top surface of the mold substrate;

bonding the mold substrate to an adhesive substrate such that the light blocking layer formed on the top surface contacts the adhesive substrate; and forming a light blocking pattern on the concave pattern by separating the adhesive substrate from the mold substrate to partially remove portions of the light blocking layer contacting the adhesive substrate.

9. The imprinting method of claim 8, wherein the adhesive substrate comprises an epoxy resin.

10. The imprinting method of claim 9, further comprising, prior to the bonding the mold substrate to an adhesive substrate, initiating a first cure of the epoxy resin to a degree of cure of about 70% or less by heating the adhesive substrate.

11. The imprinting method of claim 10, further comprising, prior to the separating, initiating a second cure of the epoxy resin to a degree of cure of about 70% or above by heating the adhesive substrate.

12. The imprinting method of claim 8, wherein the mold substrate comprises quartz.

13. The imprinting method of claim 8, wherein the photoresist film comprises a positive-type photoresist.

14. A method of manufacturing a thin film transistor substrate, the method comprising:

preparing a mold substrate with a concave pattern recessed from a top surface of the mold substrate;

forming a light blocking layer on the concave pattern and the top surface of the mold substrate;

preparing an adhesive substrate facing the mold substrate;

bonding the mold substrate to the adhesive substrate such that the light blocking layer formed on the top surface makes contact with the adhesive substrate;

forming a light blocking pattern on the concave pattern of the mold substrate by separating the adhesive substrate from the mold substrate to partially remove the light blocking layer;

sequentially forming a gate electrode, a gate insulating layer, a silicon layer, a metal layer, and a photoresist film on a substrate;

providing an imprint substrate on the photoresist film;

forming a convex pattern, which corresponds to the concave pattern formed on the imprint substrate, on the photoresist film by pressing the imprint substrate against the mold substrate;

forming a photoresist pattern on the metal layer by exposing and developing the photoresist film using the imprint substrate as a mask, so as to partially remove the photoresist film; and forming a silicon pattern, a source electrode, and a drain electrode on the gate insulating layer by etching the metal layer and the silicon layer using the photoresist pattern as a mask.

15. The method of claim 14, wherein the mold substrate comprises a protrusion part that extends from a bottom surface of the concave pattern and is lower than the top surface.

16. The method of claim 15, wherein the photoresist pattern is formed with a convex part corresponding to the protrusion part, and the metal layer is removed from a portion of the photoresist pattern corresponding to the protrusion part.

17. The method of claim 14, wherein the adhesive substrate comprises an epoxy resin.

18. The method of claim 14, wherein the photoresist film comprises a positive-type photoresist.

* * * * *